(12) United States Patent
Adachi et al.

(10) Patent No.: US 11,108,040 B2
(45) Date of Patent: Aug. 31, 2021

(54) POSITIVE ELECTRODE MATERIAL AND SECONDARY BATTERY USING SAME

(71) Applicant: TOYOTA JIDOSHA KABUSHIKI KAISHA, Toyota (JP)

(72) Inventors: Masaki Adachi, Toyota (JP); Ryuta Sugiura, Toyohashi (JP); Yuji Yamamoto, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 362 days.

(21) Appl. No.: 16/354,342

(22) Filed: Mar. 15, 2019

(65) Prior Publication Data
US 2019/0296338 A1 Sep. 26, 2019

(30) Foreign Application Priority Data
Mar. 26, 2018 (JP) .............................. JP2018-058325

(51) Int. Cl.
| | |
|---|---|
| *H01M 4/36* | (2006.01) |
| *H01L 29/24* | (2006.01) |
| *H01M 4/62* | (2006.01) |
| *H01M 4/52* | (2010.01) |
| *H01M 4/48* | (2010.01) |
| *H01M 4/58* | (2010.01) |
| *H01M 4/50* | (2010.01) |
| *H01M 4/02* | (2006.01) |
| *H01M 4/525* | (2010.01) |
| *H01M 10/0525* | (2010.01) |

(52) U.S. Cl.
CPC ............ *H01M 4/366* (2013.01); *H01L 29/24* (2013.01); *H01M 4/48* (2013.01); *H01M 4/502* (2013.01); *H01M 4/523* (2013.01); *H01M 4/5815* (2013.01); *H01M 4/628* (2013.01); *H01M 4/525* (2013.01); *H01M 10/0525* (2013.01); *H01M 2004/028* (2013.01)

(58) Field of Classification Search
None
See application file for complete search history.

(56) References Cited

U.S. PATENT DOCUMENTS

2011/0111291 A1   5/2011  Koga

FOREIGN PATENT DOCUMENTS

| CN | 104091918 A | 10/2014 |
|---|---|---|
| JP | 2000100433 A | 4/2000 |
| JP | 2009-164000 A | 7/2009 |
| JP | 2013-211260 A | 10/2013 |
| JP | 2014-053274 A | 3/2014 |
| JP | 2014146473 A | 8/2014 |
| JP | 6011232 B2 | 9/2016 |
| KR | 20170118493 A | 10/2017 |

OTHER PUBLICATIONS

Bao LiYing et al., "Methods for promoting electrochemical properties of $LiN_{1/3}Co_{1/3}Mn_{1/3}O_2$ for lithium-ion batteries", Chinese Science Bulletin, vol. 58 No. 16, 2013, pp. 1869-1875 ( 7 pages total).

*Primary Examiner* — Sarah A. Slifka
(74) *Attorney, Agent, or Firm* — Sughrue Mion, PLLC

(57) ABSTRACT

One aspect of the invention provides a positive electrode material for a secondary battery including a positive electrode active material and a coating layer. The coating layer includes an ionic crystalline p-type semiconductor material and an ionic crystalline n-type semiconductor material which are both disposed on a surface of the positive electrode active material.

7 Claims, 2 Drawing Sheets

POSITIVE ELECTRODE MATERIAL AND SECONDARY BATTERY USING SAME

CROSS REFERENCE TO RELATED APPLICATIONS

This application claims the benefit of priority to Japanese Patent Application No. 2018-058325 filed on Mar. 26, 2018. The entire contents of this application are hereby incorporated herein by reference.

BACKGROUND OF THE DISCLOSURE

1. Field

The invention relates to a positive electrode material and to a secondary battery using the same.

2. Background

One approach of achieving improved performance in secondary batteries that is currently under investigation is to further increase the battery durability. In connection with this, positive electrode materials wherein a coating layer is provided on the surface of a positive electrode active material, and secondary batteries which use such positive electrode materials are disclosed in, for example, Japanese Patent Application Laid-open No. 2014-053274, Japanese Patent Application Laid-open No. 2013-211260 and Japanese Patent Application Laid-open No. 2009-164000. For example, the coating layer in Japanese Patent Application Laid-open No. 2014-053274 consists of, in an alternately layered arrangement: cationic material layers having a positive zeta potential and anionic material layers having a negative zeta potential. Japanese Patent Application Laid-open No. 2014-053274 discloses that material layers having zeta potentials of opposite sign to the zeta potential particles of the positive electrode active material are joined to the surface of the positive electrode active material. Hence, in this art, the positive electrode active material and the coating layer are joined by Coulomb forces. As a result, direct contact between the positive electrode active material and the electrolyte can be suppressed for a long period of time.

SUMMARY

However, according to investigations by the inventors, in terms of achieving higher power density, there remains room for improvement in the above art. That is, in secondary batteries, charge carrier ion insertion reactions to the interior of the positive electrode active material include the following three steps: (1) a step in which solvated charge carrier ions are desolvated; (2) a step in which the desolvated charge carrier ions are conducted along the surface of the positive electrode active material, and (3) a step in which the desolvated charge carrier ions intercalate to the interior of the positive electrode active material. In Japanese Patent Application Laid-open No. 2014-053274, an electrical field arises that is oriented in a direction from the positive electrode active material to the electrolyte. Because of this, when charge carrier ions are inserted into the positive electrode active material, the charge carrier ions are not readily conducted along the surface of the positive electrode active material. As a result, step (2) was thought to be rate-determining, lowering the power characteristics.

The present invention was conceived in order to resolve this problem. The object of the invention is to provide a positive material with which a secondary battery having excellent power characteristics can be created. A further, related, object is to provide a secondary battery having excellent power characteristics.

Accordingly, in one aspect, the invention provides a positive electrode material for a secondary battery, which material includes a positive electrode active material and a coating layer disposed on a surface of the positive electrode active material. The coating layer includes a p-type semiconductor material that is an ionic crystal and an n-type semiconductor material that is an ionic crystal, which semiconductor materials are both disposed on the surface of the positive electrode active material.

In the positive electrode material, the ionic crystalline p-type semiconductor material and the ionic crystalline n-type semiconductor material are each disposed so as to be in contact with the surface of the positive electrode active material. Hence, when an electrical current is applied to the positive electrode material, the chemical potential at the surface of the positive electrode active material becomes inhomogeneous and a chemical potential gradient arises in a direction that follows the surface of the positive electrode active material. Because of this, the conduction of charge carrier ions along the surface of the positive electrode active material by electrophoresis readily arises. In other words, this enables step (2) to be smoothly carried out. Therefore, by using this positive electrode material, when charge carrier ions are introduced to the interior of the positive electrode active material, the rate of migration by the charge carrier ions increases, enabling a secondary battery having excellent power characteristics to be achieved.

In one aspect of the positive electrode material disclosed herein, a plurality of p-type semiconductor materials are dispersedly arranged as islands on the surface of the positive electrode active material and a plurality of n-type semiconductor materials are dispersedly arranged as islands in gaps among the plurality of dispersedly arranged p-type semiconductor materials. The advantageous effects of the coating layers can in this way be exhibited to a high degree, enabling the output characteristics to be even further improved.

In one aspect of the positive electrode material disclosed herein, the p-type semiconductor material and the n-type semiconductor material each include an oxide semiconductor or a sulfide semiconductor or both. It is preferable for the p-type semiconductor material to include at least one compound having a high hole carrier density from among, for example, NiO, CoO, $MnO_2$ and $CuGaS_2$. Also, it is preferable for the n-type semiconductor material to include at least one compound having a high free electron carrier density from among, for example, $SnO_2$, $TiO_2$ and $Bi_2S_3$.

In one aspect of the positive electrode material disclosed herein, the coating layer has an average coating thickness of at least 10 nm and up to 100 nm. This reduces the internal resistance of the positive electrode to a high degree, enabling even better output characteristics to be achieved. Moreover, the relative amount of positive electrode active material within the positive electrode is increased, enabling a secondary battery having a high energy density to be achieved.

In one aspect, the present invention further provides a secondary battery having a positive electrode that includes the positive electrode material. This secondary battery has excellent power characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the art disclosed herein are described below in conjunction with the diagrams. Note that technical matters which are required for carrying out the present invention (e.g., other battery components that are not distinctive to the art disclosed herein, and ordinary production processes for batteries) but are other than those concerning which particular mention is made in the present specification (e.g., composition and properties of positive electrode material) may be understood as matters for design by persons of ordinary skill in the art based on prior art in the field. The invention disclosed herein may be carried out based on the technical details disclosed in the specification and on common general technical knowledge in the field. In the attached drawings, members or features having like functions are designated by like symbols, and repeated explanations may be omitted or simplified. Dimensional relationships (length, width, thickness, etc.) in the diagrams do not necessarily reflect actual dimensional relationships. Also, in the present specification, numerical ranges denoted as "A to B" (where A and B may be any numerical values) are intended to mean "at least A and up to B."

Positive Electrode Material

Figure 1:
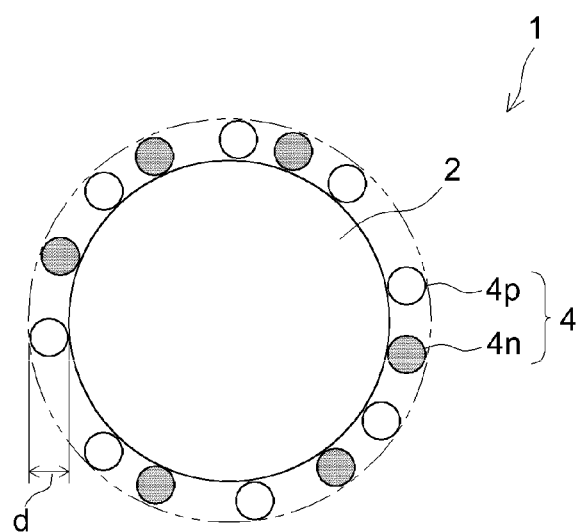
FIG. 1 is a schematic view showing the positive electrode material according to one embodiment of the invention.

FIG. 1 is a schematic view showing the cross-sectional structure of the positive electrode material 1 according to one embodiment of the invention. Although not intended to be particularly limitative, this positive electrode material 1 is used by way of illustration in the following detailed description of the art disclosed herein.

The positive electrode material 1 is a material that can be used in the positive electrode of a secondary battery. The positive electrode material 1 is made up of composite particles. The positive electrode material 1 includes a positive electrode active material 2 and a coating layer 4. The positive electrode active material 2 is the portion that serves as the core of the positive electrode material 1. The coating layer 4 is disposed on the surface of the positive electrode active material 2. The coating layer 4 is disposed on a side that is closer to the electrolyte than to the positive electrode active material 2. The coating layer 4 is not formed on portions of the surface of the positive electrode active material 2, and so portions of the surface of the positive electrode active material 2 can come into direct contact with the electrolyte of the secondary battery. The coating layer 4 physically and/or chemically adheres to the surface of the positive electrode active material 2. The positive electrode material 1 has interfaces where the positive electrode active material 2 and the coating layer 4 come into mutual contact. The positive electrode active material 2 and the coating layer 4 adhere to each other and are integrally united.

The positive electrode active material 2 should be a material which is capable of reversibly intercalating and deintercalating a charge carrier (e.g., in a lithium ion secondary battery, lithium ions). The positive electrode active material 2 is not particularly limited; one or two or more types may be suitably selected and used from among those that have hitherto been used in the art. The positive electrode active material 2 may have, for example, the nature of a p-type semiconductor and/or an n-type semiconductor. The positive electrode active material 2 is exemplified by, in lithium ion secondary batteries, compounds that include lithium and one or two or more transition metal elements (lithium-transition metal composite oxides). The lithium-transition metal composite oxide preferably includes one or two or more of Ni, Co and Mg as the transition metal element. Typical examples of lithium-transition metal composite oxides include lithium-transition metal composite oxides having a layered structure, lithium-transition metal composite oxides having a spinel structure, and lithium-transition metal-containing phosphates having an olivine structure.

Specific examples of lithium-transition metal composite oxides include lithium and nickel-containing composite oxides, lithium and cobalt-containing composite oxides, lithium and manganese-containing composite oxides, lithium, nickel and manganese-containing composite oxides, lithium, nickel, cobalt and manganese-containing composite oxides and lithium, nickel, cobalt and aluminum-containing composite oxides. Of these, lithium, nickel, cobalt and manganese-containing composite oxides are preferred on account of their excellent output characteristics and high rate cycle characteristics.

In this embodiment, the positive electrode active material 2 is in the form of particles. The average particle size of the positive electrode active material 2 is not particularly limited. However, taking into account, for example, the workability when forming the coating layer 4 on the surface of the positive electrode active material 2, it is desirable for the average particle size to be generally at least 1 μm, such as at least 5 μm. Also, the average particle size of the positive electrode active material 2, from the standpoint of forming a dense and uniform positive electrode, is generally not more than 30 μm, and typically not more than 20 μm. For example, an average particle size of not more than 10 μm is desirable. In this specification, "average particle size" refers to the particle size at 50% on the cumulative volume curve from the small particle diameter side in the volume-basis particle size distribution measured using a laser diffraction scattering method. Also, the positive electrode active material 2 is preferably, although not particularly limited to, approximately spherical with an average aspect ratio (major axis/minor axis ratio) of from about 1 to about 1.5, for example, spherical with an average aspect ratio of from 1 to 1.3.

The coating layer 4 includes a p-type semiconductor material 4p and an n-type semiconductor material 4n. The p-type semiconductor material 4p and the n-type semiconductor material 4n are each disposed on the surface of the positive electrode active material 2 and in contact with the positive electrode active material 2. The p-type semiconductor material 4p and the n-type semiconductor material 4n may or may not be in contact with each other. In this embodiment, a plurality of p-type semiconductor materials 4p and a plurality of n-type semiconductor materials 4n may each be discontinuously arranged such as in the form of dots (islands) on the surface of the positive electrode active material 2. The p-type semiconductor material 4p and the n-type semiconductor material 4n are substantially uniformly dispersed on the surface of the positive electrode active material 2. The p-type semiconductor material 4p and the n-type semiconductor material 4n are each scatteringly (sparsely) arranged on the surface of the positive electrode active material 2. For example, a plurality of p-type semiconductor material 4p are dispersedly arranged as islands on the surface of the positive electrode active material 2 and a plurality of n-type semiconductor materials 4n are dispersedly arranged as islands in gaps among the plurality of dispersedly arranged p-type semiconductor materials 4p. In this way, the p-type semiconductor material 4p and the n-type semiconductor material 4n are alternately arranged on any line on the surface of the positive electrode active material 2. Because the p-type semiconductor material 4p and the n-type semiconductor material 4n are alternately arranged on at least a portion of the surface of the positive electrode active material 2, the advantageous effects of the art disclosed herein can be exhibited to an even higher degree.

In this specification, "the p-type semiconductor material 4p and the n-type semiconductor material 4n are alternately arranged" means that, when the positive electrode material 1 is cut at a random position and the cross-section of the positive electrode material 1 is examined with an electron microscope, on the surface of the positive electrode active material 2, it has at least one of the following: (a) a repeating structure portion in which p-type semiconductor regions composed of p-type semiconductor material 4p, n-type semiconductor regions composed of n-type semiconductor material 4n and p-type semiconductor regions composed of p-type semiconductor material 4p are arranged in this order; and (b) a repeating structure portion in which n-type semiconductor regions composed of n-type semiconductor material 4n, p-type semiconductor regions composed of p-type semiconductor material 4p and n-type semiconductor regions composed of n-type semiconductor material 4n are arranged in this order. It is more preferable for the positive electrode material 1 to have a plurality of such repeating structural portions (a) or repeating structural portions (b).

The coating layer 4, by causing the charge carrier ions to electrophorese along the surface of the positive electrode active material 2, functions so as to accelerate insertion of the charge carrier ions to the interior of the positive electrode active material 2. That is, when electrical current passes through the positive electrode material 1, the p-type semiconductor material 4p and the n-type semiconductor material 4n together form a Schottky junction and/or a pn junction (here and below, this includes pn-n junctions, pp-n junctions, p$^+$pn junctions and pnn$^+$ junctions). Preferably, they form a Schottky function having excellent high-speed operation. This leads to the formation of two charges at the surface of the positive electrode active material 2; a first interfacial charge originating in the p-type semiconductor material 4p and a second interfacial charge (unlike the first charge) originating in the n-type semiconductor material 4n. As a result, the chemical potential at the surface of the positive electrode active material 2 becomes inhomogeneous, and a chemical potential gradient oriented along the surface of the positive electrode active material 2 arises. In other words, there arises an electrical field oriented along the surface of the positive electrode active material 2. This enables the high-speed migration of charge carrier ions along the surface of the positive electrode active material 2.

The p-type semiconductor material 4p and the n-type semiconductor material 4n are each crystals formed by ion bonds; i.e., they are ionic crystals. Typically, p-type semiconductor material 4p and the n-type semiconductor material 4n are each inorganic compound semiconductors. The p-type semiconductor material 4p and n-type semiconductor material 4n are each typically constituted without the element that forms the charge carrier ions (e.g., lithium in a lithium ion secondary battery). The p-type semiconductor material 4p and the n-type semiconductor material 4n preferably include at least one mutually differing metal element. The p-type semiconductor material 4p and the n-type semiconductor material 4n are preferably each materials that exhibit ionic conductivity of the charge carrier ions (e.g., lithium ions in a lithium-ion secondary battery); that is, they are preferably ionic conductors. The p-type semiconductor material 4p and the n-type semiconductor material 4n each have an ionic conductivity for the charge carrier ions at room temperature (25° C.) which, based on the alternating current impedance method, is generally at least $10^{-5}$ S/cm, preferably at least $10^{-4}$ S/cm, and more preferably at least $10^{-3}$ S/cm. For example, the conductivity may be at least $10^{-2}$ S/cm. This enables the diffusion resistance of the positive electrode material 1 to be kept low.

The p-type semiconductor material 4p is a semiconductor having, as positive charge carriers, numerous holes. Aside from being an ionic crystal, the p-type semiconductor material 4p is not particularly limited; one or two or more types may be suitably selected and used from among those hitherto used in the art. Typical examples of the p-type semiconductor material 4p include oxides (sometimes referred to below as "oxide semiconductors"), composite oxides, nitrides, oxynitrides, sulfides (sometimes referred to below as "sulfide semiconductors"), oxysulfides and nitrosulfides of various metals. Of these, at least an oxide semiconductor or a sulfide semiconductor, both of which have excellent ionic conductivity, and especially a sulfide semiconductor, is preferably included.

Exemplary p-type oxide semiconductors include transition metal oxides, such as $Cu_2O$, $NiO$, $CoO$, $FeO$, $MnO$, $Cr_2O_3$ and $MoO_2$. Of these, $NiO$, $CoO$ and $MnO$ are preferred because the hole carrier density is high. Exemplary p-type sulfide semiconductors include chalcogenides containing sulfur as the chalcogen element and at least one metal element from among copper, indium and gallium. Specific examples include $CuS$, $Cu_2S$, $CuInS_2$, $CuGaS_2$, $Cu_2ZnSnS_4$ and $Cu_2ZnGeS_4$. Of these, from the standpoint of durability and the like, chalcogenides that include sulfur and copper as essentially constituents are preferred, with $CuGaS_2$ being especially preferred. In addition, chalcogenides that include, for example, selenium as the chalcogen element and at least one metal element from among copper, indium and gallium, examples of which include selenium compounds such as $CuSe$, $Cu_2Se$, $CuInSe_2$, $CuGaSe_2$, $CuAlSe_2$, $Cu_2ZnSnSe_4$ and $Cu_2ZnGeSe_4$, can also be used as the p-type semiconductor material 4p.

The n-type semiconductor material 4n is a semiconductor having, as charge-carrying carriers, many free electrons bearing a negative electrical charge. Other than being an ionic crystal, the n-type semiconductor material 4n is not limited; use can be made of one or two or more suitably selected from among those used in the prior art. Typical examples of the n-type semiconductor material 4n include oxides (oxide semiconductors), composite oxides, nitrides, oxynitrides, sulfides (sulfide semiconductors), oxysulfides and nitrosulfides of various metals. Of these, at least an oxide semiconductor or a sulfide semiconductor, both of which have excellent ionic conductivity, and especially a sulfide semiconductor, is preferably included. For example, the p-type semiconductor material 4p and the n-type semiconductor material 4n may be oxides and/or sulfides of mutually differing metal elements.

Exemplary n-type oxide semiconductors include transition metal oxides, such as $TiO_2$, $Fe_2O_3$, $ZrO_2$, $SnO_2$, $ZnO$, $WO_3$, $Nb_2O_5$ and $Ta_2O_5$. Of these, $TiO_2$ and $SnO_2$ are preferred because they have a high free-electron carrier density. Specific examples of n-type sulfide semiconductors include $Bi_2S_3$, $Sb_2S_3$, CdS, ZnS, $In_2S_3$, PbS and $WS_2$. Of these, $Bi_2S_3$ is preferred because the free-electron carrier density is high.

The coating layer 4 may be arranged so as to cover only a portion of the surface of the positive electrode active material 2, as shown in FIG. 1. The coating layer 4 may be arranged so as to cover at least about one-half, and typically at least 80%, such as at least 90%, of the total surface area of the positive electrode active material 2, or may be arranged so as to cover the entire surface area of the positive electrode active material 2. The weight ratio between the n-type semiconductor material 4n and the p-type semiconductor material 4p, although not particularly limited, is generally between 10:1 and 1:10, typically between 5:1 and 1:5, preferably between 3:1 and 1:3, and more preferably between 2:1 and 1:2. In FIG. 1, the n-type semiconductor material 4n and the p-type semiconductor material 4p are each depicted as a single layer, but the present invention is not limited in this respect. In the coating layer 4, an n-type semiconductor material 4n in particulate form, for example, may be composed of a plurality of layers stacked on the surface of the positive electrode active material 2. Likewise, in the coating layer 4, a p-type semiconductor material 4p in particulate form, for example, may be composed of a plurality of layers stacked on the surface of the positive electrode active material 2.

Although the invention is not limited in this respect, the coating layer 4 may be fused to the surface of the positive electrode active material 2. The diffusion resistance of the positive electrode material 1 can thereby be kept low compared with cases in which the positive electrode active material 2 and the coating layer 4 are merely in surface contact. In this specification, "fusion" refers to the positive electrode active material 2 and the coating layer 4 being bonded together at an atomic level or molecular level such that the particles are integrally united with each other and have no boundaries therebetween. Fusion between the particles can be confirmed by, for example, examining the positive electrode material 1 with an electron microscope such as a transmission electron microscope (TEM) and checking that there are no discernible boundary lines between the particles of the positive electrode active material 2 and the coating layer 4.

The average coating thickness d of the coating layer 4, although not particularly limited, is generally at least 1 nm, and typically at least 5 nm, such as at least 10 nm. Also, the average coating thickness d of the coating layer 4 is generally not more than 1 μm (1,000 nm), preferably not more than 500 nm, and more preferably not more than 200 nm, such as not more than 100 nm. This makes it possible to reduce the internal resistance and thereby achieve a secondary battery having even better input-output characteristics. Moreover, the relative amount of positive electrode active material 2 is increased, enabling a secondary battery having a high energy density to be achieved. The average coating thickness d of the coating layer 4 can be determined from a sectional image of the positive electrode material 1 obtained by cutting the positive electrode material 1 at a random place and examining the cross-section with an electron microscope.

The average particle size of the positive electrode material 1, although not particularly limited, is generally from 1 to 30 μm, and typically from 1 to 20 μm, such as from 5 to 10 μm. The positive electrode material 1 is preferably, although not particularly limited to, approximately spherical with an average aspect ratio of from about 1 to about 1.5, for example, spherical with an average aspect ratio of from 1 to 1.3 (spherical particles).

A positive electrode material 1 such as that described above can be produced by a method which includes the step of forming the coating layer 4 which includes the p-type semiconductor material 4p and the n-type semiconductor material 4n on the surface of the positive electrode active material 2. Various known methods, such as combinatorial sputtering, combinatorial pulsed laser deposition (PLD), chemical vapor deposition (CVD), vacuum deposition, electrostatic atomization, dry mixing (a solid phase process) and wet mixing (a liquid phase process) may be suitably used as the method of forming the coating layer 4 on the surface of the positive electrode active material 2. Of these, a method that employs a combinatorial technique, such as combinatorial sputtering or combinatorial PLD, is preferred.

With a combinatorial method, the p-type semiconductor material 4p and n-type semiconductor material 4n can be collectively deposited on the surface of the positive electrode active material 2. Also, with a combinatorial method, by adjusting the deposition time, a coating layer 4 having the desired average coating thickness d can be stably formed. This enables the p-type semiconductor material 4p and the n-type semiconductor material 4n to be formed into films of uniform thickness, such as a micron-order thickness. In addition, with a combinatorial method, the p-type semiconductor material 4p and the n-type semiconductor material 4n can each be deposited as uniform islands on the surface of the positive electrode active material 2. Hence, a positive electrode material 1 in which the p-type semiconductor material 4p and the n-type semiconductor material 4n are alternately arranged on any line on the surface of the positive electrode active material 2 can be suitably produced.

Positive Electrode for Secondary Battery

The positive electrode of the secondary battery typically has a positive electrode current collector and a positive electrode active material layer formed on the positive electrode current collector. The positive electrode current collector is exemplified by an aluminum or other metal foil. The positive electrode active material layer includes at least the positive electrode material 1. In addition to the positive electrode material 1, the positive electrode active material layer may also include optional ingredients such as a conductor, a binder and a dispersant. The conductor is exemplified by carbon materials, such as carbon black, typically acetylene black or ketjen black. Examples of binders include halogenated vinyl resins such as polyvinylidene fluoride (PVdF) and polyalkylene oxides such as polyethylene oxide (PEO).

Secondary Battery

The positive electrode can be suitably used in building a secondary battery. In this specification, "secondary battery" is a term that encompasses all storage batteries (rechargeable batteries) and electricity storage elements that have an electric power-generating element and a liquid electrolyte and can be repeatedly used. Examples of secondary batteries include lithium ion secondary batteries, nickel-hydrogen batteries, lithium ion capacitors and electric double-layer capacitors. In the art disclosed herein, the secondary battery is equipped with a negative electrode, a positive electrode that includes the positive electrode material 1, and an electrolyte.

The negative electrode of the secondary battery may be the same as in the prior art, and is not particularly limited. The negative electrode typically has a negative electrode current collector and a negative electrode active material layer formed on the negative electrode current collector. The negative electrode current collector is exemplified by copper and other metal foils. The negative electrode active material layer includes at least a negative electrode active material. The negative electrode active material is exemplified by carbon materials such as graphite. In addition to the negative electrode active material, the negative electrode active material layer may also include optional ingredients such as a binder and a thickener. Exemplary binders include rubbers such as styrene-butadiene rubber (SBR) and halogenated vinyl resins such as polyvinylidene fluoride (PVdF). Exemplary thickeners include celluloses such as carboxymethylcellulose (CMC).

The electrolyte of the secondary battery may be similar to electrolytes used in the prior art and is not particularly limited. The electrolyte is typically a liquid electrolyte that exhibits a liquid state at room temperature (25° C.). The electrolyte typically includes a supporting salt and a solvent. The electrolyte may be, for example, a nonaqueous liquid electrolyte that includes a supporting salt and a nonaqueous solvent. However, the electrolyte may also be in a form other than a liquid, such as in the form of a gel, a sol or a solid. The supporting salt dissociates within the solvent, forming charge carrier ions. The charge carrier ions are typically cations, although they may be, for example, anions such as fluoride ions. For example, in a lithium ion secondary battery, the supporting salt forms lithium ions. Examples of supporting salts include fluorine-containing lithium salts such as $LiPF_6$ and $LiBF_4$. The solvent is typically a nonaqueous solvent, examples of which include aprotic solvents such as carbonates, ethers, esters, nitriles, sulfones and lactones. In addition to the supporting salt and solvent, the electrolyte may also include optional ingredients, examples of which include film-forming agents such as lithium bis (oxalate) borate (LiBOB) and vinylene carbonate (VC), and gas-forming agents such as biphenyl (BP) and cyclohexylbenzene (CHB).

In a secondary battery constituted in the above manner, the rate of migration by charge carrier ions when the charge carrier ions are inserted to the interior of the positive electrode active material 2 can be increased. That is, in the positive electrode material 1, the p-type semiconductor material 4p and the n-type semiconductor material 4n are each arranged on the surface of the positive electrode active material 2. Hence, when a current is applied to the positive electrode material 1, the chemical potential at the surface of the positive electrode active material 2 becomes inhomogeneous, giving rise to a chemical potential gradient in a direction that follows the surface of the positive electrode active material 2. As a result, the charge carrier ions electrophorese, readily giving rise to conduction along the surface of the positive electrode active material 2. By virtue of these effects, compared with positive materials having only a p-type semiconductor material on the surface of a positive electrode active material and positive materials having only an n-type semiconductor material on the surface of the positive electrode active material, secondary batteries having a relatively low internal resistance and excellent output characteristics can be advantageously achieved.

Secondary Battery Applications

Although secondary batteries which include the positive electrode material 1 in the positive electrode can be used in various applications, compared with conventional products, the migration of charge carrier ions on the positive electrode side is more rapid and the power characteristics are excellent. Accordingly, by taking full advantage of these features, the secondary battery disclosed herein can be advantageously used in applications requiring a high power density. Specifically, they can be advantageously used as a power source for on-board vehicle motors (power source for vehicle propulsion). The types of vehicle typically include, without particular limitation, vehicles such as plug-in hybrid vehicles (PHVs), hybrid vehicles (HVs) and electric vehicles (EVs). The secondary battery may be used in the form of a battery pack in which a plurality of such batteries are connected in series and/or in parallel.

The invention is illustrated more fully by way of the following examples, although it is to be understood that these examples are not intended to limit the invention.

Test Example I

Production of Positive Electrode Material

Comparative Example 1

$LiNi_{1/3}Co_{1/3}Mn_{1/3}O_2$ (average particle size, 5 μm) was furnished as the positive electrode active material. In Comparative Example 1, this was used directly as the positive electrode material.

Comparative Example 2

First, the same positive electrode active material as in Comparative Example 1 was furnished. Next, an n-type oxide semiconductor ($SnO_2$) was furnished as the target and $SnO_2$ was deposited on the surface of the positive electrode active material by PLD, thereby producing a positive electrode material having a positive electrode active material and a coating layer made of $SnO_2$ (average coating thickness, 10 nm).

Comparative Example 3

Aside from using a p-type oxide semiconductor (NiO) as the target, NiO was deposited on the surface of the positive electrode active material in the same way as in Comparative Example 2, thereby producing a positive electrode material having a positive electrode active material and a coating layer made of NiO (average coating thickness, 10 nm).

Example 1

First, the same positive electrode active material as in Comparative Example 1 was furnished. Next, an n-type oxide semiconductor ($SnO_2$) and a p-type oxide semiconductor (NiO) were furnished as the targets. The $SnO_2$ and NiO were then deposited together on the surface of the positive electrode active material by combinatorial PLD, thereby producing a positive electrode material having a positive electrode active material and a coating layer made of $SnO_2$ and NiO (average coating thickness, 10 nm). Upon examining a cross-section of the resulting positive electrode material with a TEM, it was confirmed that a coating layer composed of $SnO_2$ and NiO had formed on the surface of the positive electrode active material.

Construction of Lithium Ion Secondary Battery

Lithium ion secondary batteries were built using these positive electrode materials (Comparative Examples 1 to 3, Example 1). First, a positive electrode slurry was prepared by mixing together a positive electrode material, acetylene black as the conductor and polyvinylidene fluoride as the binder in N-methyl-2-pyrrolidone. This positive electrode slurry was coated onto the surface of aluminum foil (positive electrode current collector), dried and pressed, thereby producing a positive electrode having a positive electrode active material layer on a positive electrode current collector.

Next, a negative electrode slurry was prepared by mixing together graphite as the negative electrode active material, styrene-butadiene rubber as the binder and carboxymethylcellulose as the thickener in deionized water. This negative electrode slurry was coated onto the surface of copper foil (negative electrode current collector), dried and then pressed, thereby producing a negative electrode having a negative electrode active material layer on a negative electrode current collector.

The positive electrode and negative electrode thus produced were then placed over one another with a porous separator therebetween, thereby producing an electrode assembly. Next, the electrolyte was prepared by dissolving LiPF$_6$ as the supporting salt to a concentration of 1.0 M in a mixed solvent containing ethylene carbonate (EC) and dimethylcarbonate (DMC) in the volumetric ratio EC:DMC=3:7. The resulting electrode assembly and electrolyte were then placed in a laminate film housing and the housing was sealed, thereby completing the construction of a lithium ion secondary battery (Comparative Examples 1 to 3, Example 1).

Evaluation of Cycle Characteristics

First, the lithium ion secondary batteries built above were adjusted at a current rate of 1 C to a battery voltage state of 3.71 V. Next, in a −10° C. environment, 10 seconds of constant-current discharging was carried out at a rate of 10 C. Here, "1 C" refers to the current value that can charge the battery in one hour to the battery capacity (Ah) predicted from the theoretical capacity of the positive electrode active material. Next, the drop in battery voltage ΔV over 10 seconds was read off and, based on this battery voltage ΔV and the discharge current, the IV resistance (10-second resistance) was computed using Ohm's law. The results are shown in FIG. 2.

Figure 2:
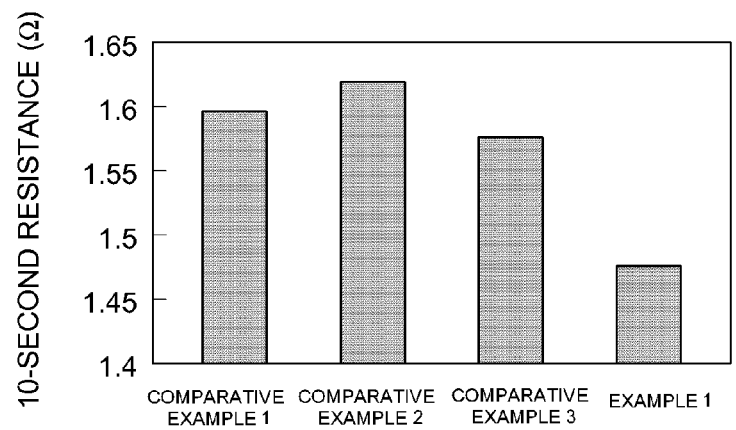
FIG. 2 is a graph comparing the 10-second resistances in Example 1 and Comparative Examples 1 to 3.

FIG. 2 is a graph comparing the 10-second resistances in Example 1 and Comparative Examples 1 to 3. As shown in FIG. 2, in Comparative Example 1 in which the positive electrode active material was used directly as the positive electrode material, the 10-second resistance was about 1.6Ω. In Comparative Example 3 in which a p-type oxide semiconductor alone was deposited on the surface of the positive electrode active material, the 10-second resistance was somewhat better than in Comparative Example 1 but still high. In Comparative Example 2 in which an n-type oxide semiconductor alone was deposited on the surface of the positive electrode active material, the 10-second resistance was even higher than in Comparative Example 1. The reason appears to be that, because the LiNi$_{1/3}$Co$_{1/3}$Mn$_{1/3}$/O$_2$ used as the positive electrode active material had the nature of a p-type semiconductor, a pn junction formed between the positive electrode active material and the coating layer, resulting in declines in the electrical conductivity and/or ion conductivity of the positive electrode material.

By contrast with these comparative examples, in Example 1 in which a p-type oxide semiconductor and an n-type oxide semiconductor were both deposited on the surface of the positive electrode active material, the 10-second resistance decreased markedly relative to Comparative Examples 1 to 3. Hence, in the lithium ion secondary battery of Example 1, the output characteristics improved about 8% relative to Comparative Example 1.

Test Example II

Comparative Examples 4 and 5

In Comparative Example 4, aside from changing the n-type oxide semiconductor used as the target to a sulfide semiconductor (Bi$_2$S$_3$), a positive electrode material was produced in the same way as in Comparative Example 2 of Test Example I. In Comparative Example 5, aside from changing the p-type oxide semiconductor used as the target to a sulfide semiconductor (CuGaS$_2$), a positive electrode material was produced in the same way as in Comparative Example 3 of Test Example 1.

Example 2

In Example 2, aside from changing the n-type oxide semiconductor used as the target to a sulfide semiconductor (Bi$_2$S$_3$) and changing the p-type oxide semiconductor used as the target to a sulfide semiconductor (CuGaS$_2$), a positive electrode material was produced in the same way as in Example 1 of Test Example 1.

Next, lithium ion secondary batteries (Comparative Examples 4 and 5, Example 2) were built in the same way as in Test Example I, and evaluations of the output characteristics were similarly carried out. The results are shown in FIG. 3.

Figure 3:
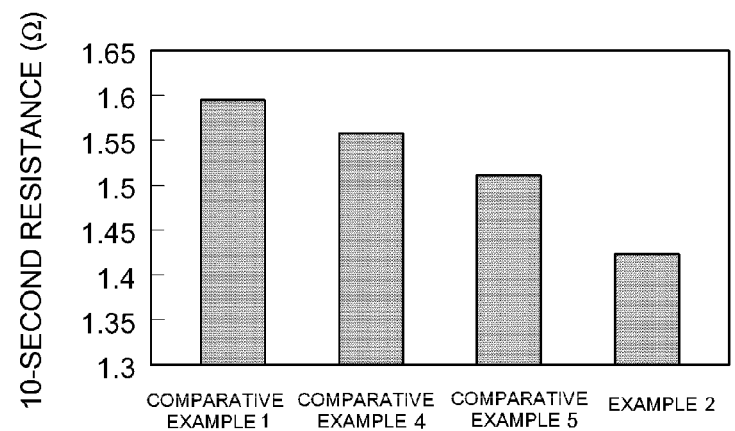
FIG. 3 is a graph comparing the 10-second resistances in Example 2 and Comparative Examples 1, 4 and 5.

FIG. 3 is a graph comparing the 10-second resistances in Example 2 and Comparative Examples 1, 4 and 5. As shown in FIG. 3, in Example 2 in which a p-type sulfide semiconductor and an n-type sulfide semiconductor were both deposited on the surface of the positive electrode active material, the 10-second resistance greatly decreased compared with Comparative Example 1 in which the positive electrode active material was used directly as the positive electrode material, Comparative Example 4 in which an n-type sulfide semiconductor alone was deposited on the surface of the positive electrode active material and Comparative Example 5 in which a p-type sulfide semiconductor alone was deposited on the surface of the positive electrode active material. Hence, in the lithium ion secondary battery of Example 2, the output characteristics improved by about 12% relative to Comparative Example 1. It was apparent from this that by using a sulfide semiconductor as the semiconductor material, the advantageous effects of the art disclosed herein are exhibited to an even higher degree.

These results confirm the technical significance of the art disclosed herein.

The terms and expressions used herein are for description only and are not to be interpreted in a limited sense. These terms and expressions should be recognized as not excluding any equivalents to the elements shown and described herein and as allowing any modification encompassed in the scope of the claims. The preferred embodiments disclosed herein may be embodied in many various forms. This disclosure should be regarded as providing preferred embodiments of the principle of the invention. These preferred embodiments are provided with the understanding that they are not intended to limit the invention to the preferred embodiments described in the specification and/or shown in the drawings. The invention is not limited to the preferred embodiment described herein. The invention disclosed herein encompasses any of preferred embodiments including equivalent elements, modifications, deletions, combinations, improvements and/or alterations which can be recognized by a person of ordinary skill in the art based on the disclosure. The elements of each claim should be interpreted broadly based on the terms used in the claim, and should not be limited to any of the preferred embodiments described in this specification or used during the prosecution of the present application.

What is claimed is:

1. A positive electrode material for a secondary battery, comprising a positive electrode active material, and a coating layer disposed on a surface of the positive electrode active material, wherein the coating layer comprises:
   a p-type semiconductor material that is an ionic crystal and disposed on the surface of the positive electrode active material, and
   an n-type semiconductor material that is an ionic crystal and disposed on the surface of the positive electrode active material.

2. The positive electrode material according to claim 1, wherein a plurality of the p-type semiconductor materials are dispersedly arranged as islands on the surface of the positive electrode active material and a plurality of the n-type semiconductor materials are dispersedly arranged as islands in gaps among the plurality of dispersedly arranged p-type semiconductor materials.

3. The positive electrode material according to claim 1, wherein the p-type semiconductor material and the n-type semiconductor material each include at least one of an oxide semiconductor and a sulfide semiconductor.

4. The positive electrode material according to claim 1, wherein the p-type semiconductor material includes at least one selected from the group consisting of NiO, CoO, $MnO_2$ and $CuGaS_2$.

5. The positive electrode material according to claim 1, wherein the n-type semiconductor material includes at least one selected from the group consisting of $SnO_2$, $TiO_2$ and $Bi_2S_3$.

6. The positive electrode material according to claim 1, wherein the coating layer has an average coating thickness of at least 10 nm and up to 100 nm.

7. A secondary battery comprising a positive electrode that includes a positive electrode material according to claim 1.

* * * * *